(12) United States Patent
Muthmann et al.

(10) Patent No.: US 9,478,384 B2
(45) Date of Patent: Oct. 25, 2016

(54) ELECTRODE FOR PRODUCING A PLASMA, PLASMA CHAMBER HAVING SAID ELECTRODE, AND METHOD FOR ANALYZING OR PROCESSING A LAYER OR THE PLASMA IN SITU

(75) Inventors: Stefan Muthmann, Aachen (DE); Aad Gordijn, Juelich (DE); Reinhard Carius, Juelich (DE); Markus Huelsbeck, Juelich (DE); Dzmitry Hrunski, Aschaffenburg (DE)

(73) Assignee: Forschungszentrum Juelich GmbH, Juelich (DE)

( * ) Notice: Subject to any disclaimer, the term of this patent is extended or adjusted under 35 U.S.C. 154(b) by 434 days.

(21) Appl. No.: 13/703,190

(22) PCT Filed: Jul. 7, 2011

(86) PCT No.: PCT/DE2011/001415
§ 371 (c)(1),
(2), (4) Date: Dec. 10, 2012

(87) PCT Pub. No.: WO2012/010146
PCT Pub. Date: Jan. 26, 2012

(65) Prior Publication Data
US 2013/0094022 A1    Apr. 18, 2013

(30) Foreign Application Priority Data

Jul. 15, 2010 (DE) .......................... 10 2010 027 224

(51) Int. Cl.
*H01J 37/04* (2006.01)
*H01J 37/22* (2006.01)
(Continued)

(52) U.S. Cl.
CPC ................ *H01J 1/02* (2013.01); *C23C 14/52* (2013.01); *C23C 16/44* (2013.01);
(Continued)

(58) Field of Classification Search
CPC ... H01J 37/32532–37/32651; H01J 37/32972; C23C 16/45563–16/4558; C23C 16/505–16/5096; C23C 14/52
See application file for complete search history.

(56) References Cited

U.S. PATENT DOCUMENTS 4,859,908 A * 8/1989 Yoshida et al. .......... 315/111.81
5,023,188 A * 6/1991 Tanaka .................. G01B 11/22
                                                           438/734

(Continued)

FOREIGN PATENT DOCUMENTS

DE          101 19 766       11/2001
DE       10 2006 047 047      4/2008
(Continued)

OTHER PUBLICATIONS

Li et al. (Li, Y.M., Ilsin A.N., Nguyen H.V., Wronski CR., Collins R.W. (1991). Real-Time Spectroscopic Ellipsometry Deiermination of the Evolution of Amorphous-Semiconductor Optical Functions, Bandgap, and Microstructure. Journal of Non-Crystalline Solids Vo., 137- 787-790).

(Continued)

Primary Examiner — Mariceli Santiago
(74) Attorney, Agent, or Firm — Jordan and Kosa, PLLC

(57) ABSTRACT

A RF electrode for generating, plasma in a plasma chamber comprising an optical feedthrough. A plasma chamber comprising an RF electrode and a counter-electrode with a substrate support for holding a substrate, wherein a high-frequency alternating field for generating the plasma can be formed between the RF electrode and the counter-electrode. The chamber comprising an RF electrode with an optical feedthrough. A method, for in situ analysis or in situ processing of a layer or plasma in a plasma chamber, wherein the layer is disposed on counter-electrode and an RF electrode is disposed on the side lacing the layer. Selection of an RF electrode having an optical feedthrough, and at least one step in which electromagnetic radiation is supplied through the optical feedthrough for purposes of analysis or processing of the layer or the plasma, and by at least one other step in which the scattered or emitted or reflected radiation is supplied to an analysis unit.

16 Claims, 6 Drawing Sheets

(51) Int. Cl.
*H01J 37/32* (2006.01)
*H01J 1/02* (2006.01)
*C23C 14/52* (2006.01)
*C23C 16/44* (2006.01)
*C23C 16/509* (2006.01)
*C23C 16/52* (2006.01)
*G01J 3/44* (2006.01)

(52) U.S. Cl.
CPC .......... *C23C 16/5096* (2013.01); *C23C 16/52* (2013.01); *G01J 3/44* (2013.01); *H01J 37/32* (2013.01); *H01J 37/32623* (2013.01); *H01J 37/32972* (2013.01)

(56) References Cited

U.S. PATENT DOCUMENTS

| | | | |
|---|---|---|---|
| 5,242,532 | A | 9/1993 | Cain |
| 5,643,394 | A * | 7/1997 | Maydan ............ C23C 16/45574 118/723 E |
| 5,660,744 | A | 8/1997 | Sekine et al. |
| 5,997,649 | A * | 12/1999 | Hillman ........................ 118/715 |
| 6,502,530 | B1 | 1/2003 | Turlot et al. |
| 6,503,364 | B1 | 1/2003 | Masuda et al. |
| 6,633,720 | B1 * | 10/2003 | Xu ....................... G02B 6/4248 385/138 |
| 6,755,932 | B2 | 6/2004 | Masuda et al. |
| 7,306,829 | B2 | 12/2007 | Turlot et al. |
| 8,974,628 | B2 * | 3/2015 | Nozawa et al. ......... 156/345.24 |
| 2001/0015175 | A1* | 8/2001 | Masuda ................ G01N 21/68 118/723 R |
| 2002/0139925 | A1 | 10/2002 | Mitrovic |
| 2003/0038112 | A1* | 2/2003 | Liu et al. ........................ 216/60 |
| 2003/0070761 | A1 | 4/2003 | Turlot et al. |
| 2004/0084146 | A1* | 5/2004 | Sekiya ............. H01J 37/32495 156/345.24 |
| 2004/0118518 | A1 | 6/2004 | Masuda et al. |
| 2005/0029228 | A1 | 2/2005 | Nozawa et al. |
| 2006/0196846 | A1 | 9/2006 | Honda |
| 2007/0256786 | A1* | 11/2007 | Zhou ................. H01J 37/32477 156/345.34 |
| 2008/0093341 | A1 | 4/2008 | Turlot et al. |
| 2008/0299326 | A1* | 12/2008 | Fukazawa et al. ........... 427/569 |
| 2009/0151636 | A1* | 6/2009 | White et al. ........... 118/723 ME |
| 2009/0163034 | A1 | 6/2009 | Larson et al. |
| 2010/0009469 | A1 | 1/2010 | Kai et al. |

FOREIGN PATENT DOCUMENTS

| | | |
|---|---|---|
| WO | WO-01/22144 | 3/2001 |
| WO | WO-2007/022144 | 2/2007 |

OTHER PUBLICATIONS

Wagner el al. (Wagner V., Drews, D., Esser, D.R., Zahn, T., Geurts, J., and W. Richter. Raman monitoring of semiconductor growth, J, Appl. Phys. 75, pp. 7330-7333).

Dingemans et al. (Dingemans, G.; van den Donker, M.N.; Hrunski, D.; Gordijn A., Kessels, W. M. M.; van de Sanden, M. C. M. (2007). In-situ Film Transmittance Using the Plasma as Light Source: A Case Study of Thin Silicon Film Deposition in the Microcrystalline Growth Regime. Proceedings of the 22nd EUPVSEC (European Photovoltaic Solar Energy Conference), Milan/Italy, Mar. 9, 2007-Jul. 9, 2007.—S. 1855-1858).

* cited by examiner

ELECTRODE FOR PRODUCING A PLASMA, PLASMA CHAMBER HAVING SAID ELECTRODE, AND METHOD FOR ANALYZING OR PROCESSING A LAYER OR THE PLASMA IN SITU

BACKGROUND OF THE INVENTION

The invention relates to an electrode for generating plasma, a plasma chamber comprising the electrode and a method for the in situ analysis or in situ processing of a layer, or of the plasma.

The in situ characterization of an amorphous layer during plasma enhanced chemical vapor deposition (PECVD) is known from Li et al. (Li, Y. M., Ilsin A. M., Ngyuen H. V., Wronski C R., Collins R. W. (1991). Real-Time-Spectroscopic Ellipsometry Determination of the Evolution of Amorphous-Semiconductor Optical Functions, Bandgap, and Micrsotructure. *Journal of Non-Crystalline Solids*. Vol. 137, 787-790). The authors used a method of spectroscopic ellipsometry under irradiation with light at a 70° angle. Disadvantageously, the method and the ellipsometer used only provide a comparatively limited amount of information on the layer properties.

Wagner et al. (Wagner V., Drews, D., Esser, D. R., Zahn, T., Geurts, J., and W. Richter. Raman monitoring of semiconductor growth. *J. Appl. Phys.* 75, 7330) describe in situ Raman spectroscopy of a layer deposited using molecular beam epitaxy. The method and the design of the device used are disadvantageous in that usage is limited in terms of the type of deposition process.

The use of optical emission spectroscopy in situ for the plasma of a plasma chamber is known from Dingemans et al. (Dingemans, G.; van den Donker, M. N.; Hrunski, D.; Gordijn, A.; Kessels, W. M. M.; van de Sanden, M. C. M. (2007). In-situ Film Transmittance Using the Plasma as Light Source: A Case Study of Thin Silicon Film Deposition in the Microcrystalline Growth Regime. *Proceedings of the 22nd EUPVSEC* (European Photovoltaic Solar Energy Conference), Milan/Italy, Mar. 9, 2007-Jul. 9, 2007.-S. 1855-1858). Here, an optical feedthrough is provided at the counter-electrode of the plasma chamber, the feedthrough being used to examine the plasma directly through the substrate. This device is unsuitable for collecting advanced information, which is also a disadvantage.

SUMMARY OF THE INVENTION

The object of the invention is to provide an electrode for generating plasma in a plasma chamber, the electrode being universally applicable independent of the deposition process used, such as PECVD, MOVPE, and independent of the testing method selected, such as Raman spectroscopy and optical emission spectroscopy.

Another object of the invention is to provide a plasma chamber for performing, in situ, a multitude of testing methods independent of the layer manufacturing process.

Another object of the invention is to provide a method for analyzing a layer to be deposited, as well as the process gases, in situ while the manufacturing process is ongoing.

This object is achieved by an RF electrode according to the main claim, a plasma chamber comprising such an electrode, and a method according to the secondary claims. Advantageous embodiments can be found in the respective dependent claims.

According to the invention, an RF electrode for generating the plasma uses a high-frequency voltage. The plasma can be used for depositing semiconductor layers or for plasma etching of semiconductor layers, for example. In the first case, gases such as $SiH_4$ or $H_2$ are introduced to the chamber, and in the second case, a gas such $NF_3$ is introduced.

According to the invention, the RF electrode is characterized by comprising an optical feedthrough. The optical feedthrough advantageously allows optical access to the plasma space itself and through the plasma space to the substrate which is disposed at the counter-electrode (also called the ground electrode). The passage of a beam path through the optical feedthrough in the RF electrode according to the invention is thus allowed. The advantageous effect is that it is possible to both analyze and process the substrate and the layer growing thereon while the plasma burns. A particularly advantageous effect of providing the optical feedthrough in the RF electrode is that the plasma itself can also be examined in the plasma chamber with regard to gas composition, and this composition can be adjusted.

This provides a large degree of freedom in selecting the testing method and the processing method.

In the context of the invention, it was found that the prior art is limited with regard to the placement of an optical feedthrough in the counter-electrode of Dingemans et al and with regard to the testing method used in Li et al., as well as the deposition method in Wagner et al. Only the RF electrode according to the invention allows a wide variety of testing or processing steps for the layer and the plasma with substantially every deposition method (PECVD, MOVPE and others) in situ. By relying on the RF electrode according to the invention for both the entrance to the plasma chamber and the issue of electromagnetic radiation, the method according to the invention uses an angle of incidence of approximately zero degrees relative to the layer to be deposited. The advantageous effect of this is that even Raman spectroscopy can be carried out on a growing layer, or locally resolved optical emission spectroscopy can be carried out on the plasma, while the plasma is burning (in situ). The processing of the layer can involve a processing step with a laser.

It is especially advantageous that direct observation of a layer is made possible by the optical feedthrough in the RF electrode by coupling the light in and out at an angle of incidence of approximately zero degrees relative to the layer. Minimal deviations from an angle of incidence of zero degrees are conceivable.

In the prior art, on the other hand, the beam path for analyzing the layer is irradiated at an angle of 70° relative to the layer. This has the disadvantage that a large portion of the deposition space in the plasma chamber is included, and thus incorrectly analyzed and interpreted. In the invention, it was found that this form of in-situ analysis generated incorrect results in the interpretation of layer properties or plasma properties.

It was also found that, previously, primarily with small electrode distances relative to the electrode surface, only an edge area of the layer could be analyzed, or the production-relevant part could only be analyzed at a specific angle. In the prior art, many investigations such as Raman spectroscopy can only be carried out after the deposition has been performed, as in Dingemans et al. The edge area of the layer refers to that part of the growing layer that lies outside the optimum area of electrode utilization, and thus that part which is irrelevant in terms of subsequent use of the layer. This excludes certain measurement methods, such as Raman spectroscopy or reflection spectroscopy, from being particularly effective ways of characterizing a deposited layer in real time, which is to say, during the deposition process. The term in situ in the present patent application refers to the analysis or processing of the substrate or a layer disposed thereon, or to be deposited thereon, while the plasma burns, which is to say, in real time.

In contrast to the prior art, with the RF electrode according to the invention, production-relevant areas of the layer can also be analyzed and processed in real time, and not just the edge areas.

One particular such analysis is in situ Raman spectroscopy. By coupling in a pulsed laser beam, via the optical feedthrough in the RF electrode, onto the layer, and by way of spectroscopy of the scattered light in direct back-reflection, Raman spectroscopy can be carried out during the deposition, for example during deposition of material for a thin-film solar cell. This makes it possible to better monitor the growth and structural properties of the layer during deposition.

Another possible analysis method is spatially resolved emission spectroscopy. Using a confocal design, with a fixed or moving lens in the beam path, plasma emissions above a growing silicon surface can be spectroscopically analyzed in a spatially resolved manner, which is to say, at difference distances from the surface of the layer. The lens can be fixed at the RF electrode. However, the lens can also be fixed inside the housing of the plasma chamber. The lens can also be disposed movably inside the housing so that a confocal measurement site is achieved for different applications. Other methods, such as reflection spectroscopy are also applicable. In addition, to achieve the same effect, the RF electrode with the lens fixed thereto can be disposed in the beam path of the measurement site so as to be mobile relative to the layer to be examined.

The optical feedthrough runs through the RF electrode from the surface on one side to the side of the RF electrode opposite thereto. Thus, the feedthrough in the spirit of the invention involves an opening through the electrode structure, the opening allowing the passage of electromagnetic radiation, and in particular laser radiation, for scanning in the direction of the growing layer. Meanwhile, the optical feedthrough allows radiation issuing from the layer, or from the plasma (i.e. reflection, scattering or thermal radiation) to be passed back to an analysis unit. This also allows for measuring the temperature of the layer. Accordingly, the electrode with the optical feedthrough is disposed in the beam path of the radiation in-coupled into the plasma chamber.

It is particularly advantageous for the electrode to be integrated into a plasma chamber in which a vacuum can be generated. The electrode is electrically insulated from the chamber wall. The RF electrode is provided with a connection means for a high frequency alternating voltage (RF connection: 30 kHz-300 GHz oscillation, preferably 13.56 MHz to 108.48 MHz). The alternating voltage of an RF generator is applied to the metal plate serving as the electrode, which is located in a low pressure chamber. Disposed parallel to the RF electrode and opposite thereto is the counter-electrode with the substrate support.

It is advantageous for the vacuum chamber to contain a window in the wall thereof as an optical feedthrough, through which the electromagnetic radiation can be coupled in and out again.

The radiation out-coupled from the plasma chamber is advantageously supplied through the lens and, if necessary, a mirror system, and is focused onto the entrance slit of a spectrograph, such as an Oriel Instrument MS260. The spectrograph is used to separate the radiation into its spectroscopic components, which are analyzed by way of a CCD camera, such as an Andor iDus 420. In the case of Raman spectroscopy, an optical notch filter is disposed in the optical path from the substrate surface to the spectroscope. The notch filter advantageously causes the wavelength used to excite the Raman scattering to be limited to a very narrow bandwidth.

In the simplest case, optical access to the layer, or to the plasma above the layer, is by way of a hole, preferably in the center or near the center of the RF electrode, so that production-relevant parts of the substrate, or of the layer to be deposited, can be analyzed or processed. This is not possible using electrodes according to the prior art.

It is particularly advantageous that the RF electrode comprises an optical feedthrough that faces the plasma chamber, and that is shielded. Shielding is preferably accomplished using a metallic mesh that is disposed on the opening of the optical feedthrough. The advantage is that of preventing disruption of the electrical field generated by the electrode.

In the context of the invention, it was found that, depending on the parameters of the deposition method being used, the optical feedthrough can result in inhomogeneities in the layer deposition process, or during etching, due to disruption of the electrical field. Accordingly, the optical feedthrough, in the RF electrode, to the plasma space, is shielded, preferably by way of a metal mesh, so that optical access is possible with minimal loss. The advantageous effect is that the high-frequency field generated by the electrode plates is largely unaffected by the optical feedthrough.

This also applies in particular to the very advantageous case in which the optical feedthrough is included in a showerhead electrode, which serves as the RF electrode.

In this case, the optical feedthrough is integrated into the showerhead electrode, which serves as the RF electrode, such that the homogeneity of the gas distribution is not disrupted. This is achieved by selecting a location for the optical feedthrough at which the gas passage is affected by the optical feedthrough only at a few holes, or most preferably at no holes.

The optical feedthrough and the metallic mesh serving as shielding can be made of the same material, such as stainless steel or aluminum.

The mesh shield can preferably be cut using a laser beam. The thickness of the mesh webs can be approximately 0.3 mm and the width of the webs can be approximately 0.1 mm, for example. Preferably, up to 12 to 19% of the opening of the optical feedthrough can be covered by the webs of the shielding. Covering up to approximately 10% of the opening with the shielding should be sufficient to maintain the homogeneity of the plasma. While optimal shielding could also be achieved using a metal plate, substrate or plasma analysis therethrough, or processing steps therethrough, would of course be impossible. It is basically possible to provide shielding with less than 10% of the area of the opening of the optical feedthrough being covered. The precise percentage of covering of the opening of the feedthrough by the shielding depends on the process conditions, such as the pressure used in the plasma chamber. In the deposition of microcrystalline silicon at a pressure of >18 Torr, an electrode separation of 9 mm, a power density of ~1 $W/cm^2$ and a growth rate of 0.5 nm/s, for a hole diameter of 1 cm facing the substrate, no shielding of the optical feedthrough is required at all.

In the deposition of microcrystalline silicon at a pressure of 10 Torr, an electrode separation of 9 mm, a power density of 0.6 $W/cm^2$ and a growth rate of 0.5 nm/s, for a hole diameter of 1 cm facing the substrate, approximately 10% of the opening of the optical feedthrough must be covered by the shielding.

In the plasma chamber according to the invention, if shielding is provided, the opening of the optical feedthrough facing the deposition zone is shielded. The entire vacuum chamber is generally referred to as the plasma chamber.

In general, the optical feedthrough must be large enough to allow the intended investigative process to be carried out through the electrode according to the invention. This method can be in situ Raman spectroscopy or optical emission spectroscopy, for example; or it can be the determination of gas concentration through optical means. The area of the optical feedthrough should be at least approximately 0.03 cm$^2$. For circular optical feedthroughs, this corresponds to a diameter of more than 2 mm for the opening facing the deposition zone. Preferably, the opening has an area of 1 to 10 cm$^2$.

A lens can be disposed at the RF electrode, or in the plasma chamber in general. The lens should focus the electromagnetic radiation through the optical feedthrough onto the plasma, or the layer, or the substrate. The same lens or, depending on the angle of incidence of the radiation, a lens of another optical feedthrough in the RF electrode parallelizes the electromagnetic radiation reflected or scattered or emitted from the substrate, or the plasma, through the optical feedthrough.

It is preferable for the angle of incidence of the electromagnetic radiation onto the substrate or the layer to be zero degrees. Minimal deviation from this angle is possible such that the angle of incidence for access to the production-relevant part of the layer or discharge zone is less than for access through the space laterally between the electrodes.

Thus, the size of the optical feedthrough should in no way be confused with the size of the openings of the holes in a showerhead electrode according to the prior art, and consequently cannot be compared with the same. These holes typically have a diameter of only approximately 0.8 mm, which corresponds to approximately 0.005 cm$^2$ of area. These prior art openings are unsuitable for analysis or processing of the layer or plasma through optical means according to the invention.

The optical feedthrough passes completely through the electrode. Thus, the electrode comprises a first opening in the surface on one side and a second opening on the surface of the electrode that is opposite this opening. Both openings of the optical feedthrough can have the same diameter. In this case, the electrode according to the invention can be particularly easy to manufacture.

It is preferable for the optical feedthrough to have a conical cross section. The optical feedthrough is then disposed in the electrode conically. With a conical feedthrough, the opening facing the plasma space has a larger area than the opening of the optical feedthrough that is opposite that opening. This then advantageously allows electromagnetic radiation issuing from the layer or the plasma to be collected and supplied to the analysis unit more efficiently.

It was found that in the simplest case, the optical feedthrough can be implemented by way of a single hole, for example a cylindrical hole, in the electrode. For example, the RF electrode can be drilled using a 10 mm drill bit. However, it is also possible to instead make a conical feedthrough in the RF electrode using a countersink bit.

The smaller of the two openings of a conical optical feedthrough can have an area of 0.03 cm$^2$ to 5 cm$^2$. The larger of the two openings of a conical optical feedthrough can have an area of 0.031 to 100 cm$^2$. It is particularly advantageous for the area of the larger opening of the optical feedthrough to be 20 times larger.

In general, the size of the opening facing away from the substrate depends on the thickness of the electrode according to the invention at a given cone angle.

Preferably, no gas flows through the optical feedthrough to the plasma space, or exactly the same amount of gas flows as would flow from the same area of an unmodified showerhead electrode. The advantageous effect of this is that the homogeneity of the gas flow is not disrupted by the optical feedthrough.

In addition to a simple hole in the electrode, an optical feedthrough can also be designed as a component. This component lines the hole in the electrode like a sleeve. In a showerhead arrangement serving as the RF electrode, for example, three gas distribution plates of different diameters are disposed one on top of the other, for example as shown in FIG. 2. These plates form the showerhead serving as the RF electrode. Holes of different sizes are provided in each of the three gas distribution plates, so as to form the optical feedthrough. In the electrode, these plates are arranged one on top of the other so that a conical optical feedthrough is formed. In addition, a funnel-like conical component for forming the conical optical feedthrough is disposed in the showerhead. This component lines the optical feedthrough from the inside. To accomplish this, the funnel comprises stepped support surfaces for the gas distribution plates. Fixing means, such as screws, fasten the plate(s) to the funnel. Advantageously, the wall of the funnel-like component prevents the gas from flowing through the optical feed into the plasma space. Here, the funnel acts as a gas seal for the optical feedthrough.

Also, depending on the deposition process parameters, a metal mesh can also be disposed on the smaller opening of the funnel-like component as a shielding.

In another embodiment of the invention, a convex converging lens, and in particular a plano-convex converging lens, is fixed at the optical feedthrough in the RF electrode. This advantageously results in the guiding of electromagnetic beam path through the optical feedthrough onto the substrate, or onto the growing layer, or into the plasma, the beam being focused onto the surface thereof for purposes of analysis or processing. This makes it possible to generate a Raman emission from the substrate or the layer by way of high energy input from a pulsed laser, and thus to carry out Raman spectroscopy on the reflected radiation. Also, the light, or in general the electromagnetic radiation, can be gathered by the lens and focused, and also parallelized.

In this case the lens is disposed on the side of the optical feedthrough not facing the plasma space. If additional shielding is provided, the lens is disposed on the side of the opening that is opposite the shielding.

It is particularly preferred that a replaceable small glass plate for protecting the converging lens is disposed between the converging lens and the opening of the optical feedthrough. This advantageously prevents the lens from being coated while the plasma burns. The advantageous effect is that the lens does not need to be removed when the chamber is cleaned. Thus advantageously, the optics do not have to be readjusted after cleaning.

A plasma chamber according to the invention comprises the RF electrode with one or more optical feedthroughs and a high-frequency RF connection.

Disposed in the chamber is a grounded or floating counter-electrode with a substrate disposed thereon. A high-frequency alternating field for generating the plasma is formed between the electrode and the counter-electrode.

According to the invention, the chamber comprises the RF electrode with the optical feedthrough. This results in the advantageous effect that electromagnetic radiation can be supplied through the optical feedthrough onto the substrate or the layer growing thereon, or into the plasma itself. In this way, the substrate, the layer or the gas composition in the chamber can be tested in situ during deposition and while the plasma is burning.

It is advantageous for the opening of the optical feedthrough facing the interior of the plasma chamber to be shielded so that a particularly homogeneous deposition or etching of the layer disposed on the substrate is produced.

A convex converging lens on the side of the optical feedthrough that faces away from the plasma chamber focuses the beam path onto the substrate, or onto the layer growing on the substrate, or onto the plasma itself. The lens gathers, focuses and parallelizes the reflected or scattered radiation, or the radiation issuing from the sample surface of the layer for the purposes of analysis. This means that the radiation reflected or scattered or emitted from the layer is in turn gathered by the optical feedthrough on its return path and is lead out of the plasma chamber.

Thus, a uniform idea is that the RF electrode and the chamber according to the invention enable a method for in situ analysis or in situ processing of a layer in the plasma chamber and the plasma while it is burning. The substrate is disposed on the counter-electrode.

The RF electrode is disposed on the side facing the substrate and at a distance X from the substrate. The process gases used for the deposition or etching are fed in and the process pressure is adjusted. Then, the plasma is started.

In one embodiment of the invention, an electrode comprising an optical feedthrough having a shielding on the side of the electrode facing the substrate is selected for the method. It is particularly advantageous that a plano-convex convergent lens is disposed on the side of the electrode located opposite the shielding.

It is preferable to select a convergent lens that has a focal length X plus the thickness of the electrode. The advantage is that a beam path passing through the optical feedthrough is focused onto the substrate. In contrast, reflected or scattered radiation, or radiation emitted from the layer surface, is gathered and led from the chamber in parallelized form by the lens. For this purpose and depending on the design of the analyzing equipment and available space, the reflected or scattered radiation, or the radiation emitted from the layer surface, can first be supplied to a mirror.

It is particularly preferable for the plasma chamber to allow the converging lens to move along the beam path. To this end, the lens is movably attached inside the housing of the plasma chamber. A plasma chamber is selected that has a support, which is attached to the electrode in a height-adjustable manner. The lens can also be attached to the RF electrode with the electrode itself being movable. Both constructions provide the advantage that different areas between the RF electrode and the layer, as well as the layer and the plasma itself, can be variably spectroscopically investigated. The height-adjustability can be ensured by way of a screw in a slot.

This allows the system to be adjusted to different lens and electrode distances during the process. Furthermore, this facilitates investigation of the growing layer and of the plasma. Of course, the converging lens can be attached to the electrode itself for the method.

Preferably, in situ Raman spectroscopy is carried out, by way of the collection of phonons by the converging lens, wherein the lens focuses the light directed at the substrate onto the layer to be investigated and the radiation reflected or scattered from the layer, or the radiation emitted from the layer surface is led out of the chamber in parallelized form.

According to the invention, the term layer is also meant to include the substrate itself.

Below, the invention is described in more detail with the aid of exemplary embodiments and the figures, but no limitation of the invention is intended here.

DESCRIPTION OF THE PREFERRED EMBODIMENTS

Figure 1:
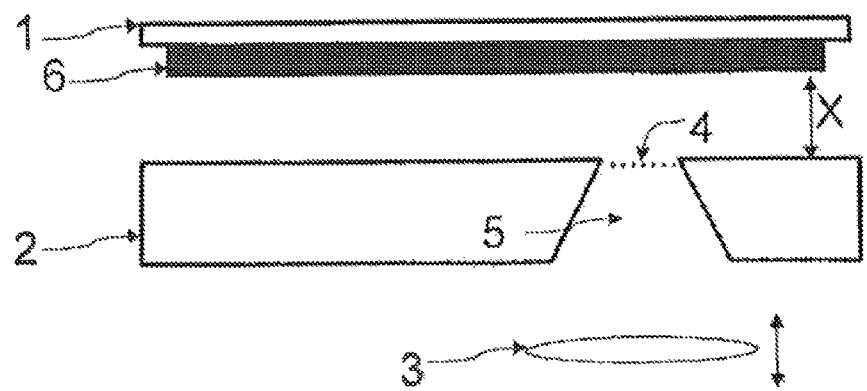
FIG. 1: A section through the RF electrode and plasma chamber according to the invention (schematic drawing).

FIG. 1 shows the principle of the solution to the problem of the invention using an optical feedthrough. The substrate 6 is disposed at electrode 1, the counter-electrode. The RF electrode 2 according to the invention comprises the optical feedthrough, which is large enough for performing in situ analysis or processing of the substrate or the plasma. To this end, the beam path is directed to the substrate and focused by the lens at an angle of incidence to the substrate of zero degrees. The area of the optical feedthrough is indicated by reference number 5. The cone of the feedthrough 5 with the smaller opening directed at the substrate advantageously allows more back-radiation from the substrate to be gathered by the lens than in the case of a simple hole feedthrough as in FIG. 3. The metallic shielding 4, represented by the dotted line, is disposed on the side of the feedthrough 5 facing the substrate. The shielding can be soldered into a groove in the optical feedthrough for this purpose. Reference number 3 indicates a height-adjustable converging lens in the support of the plasma chamber.

Figure 2:
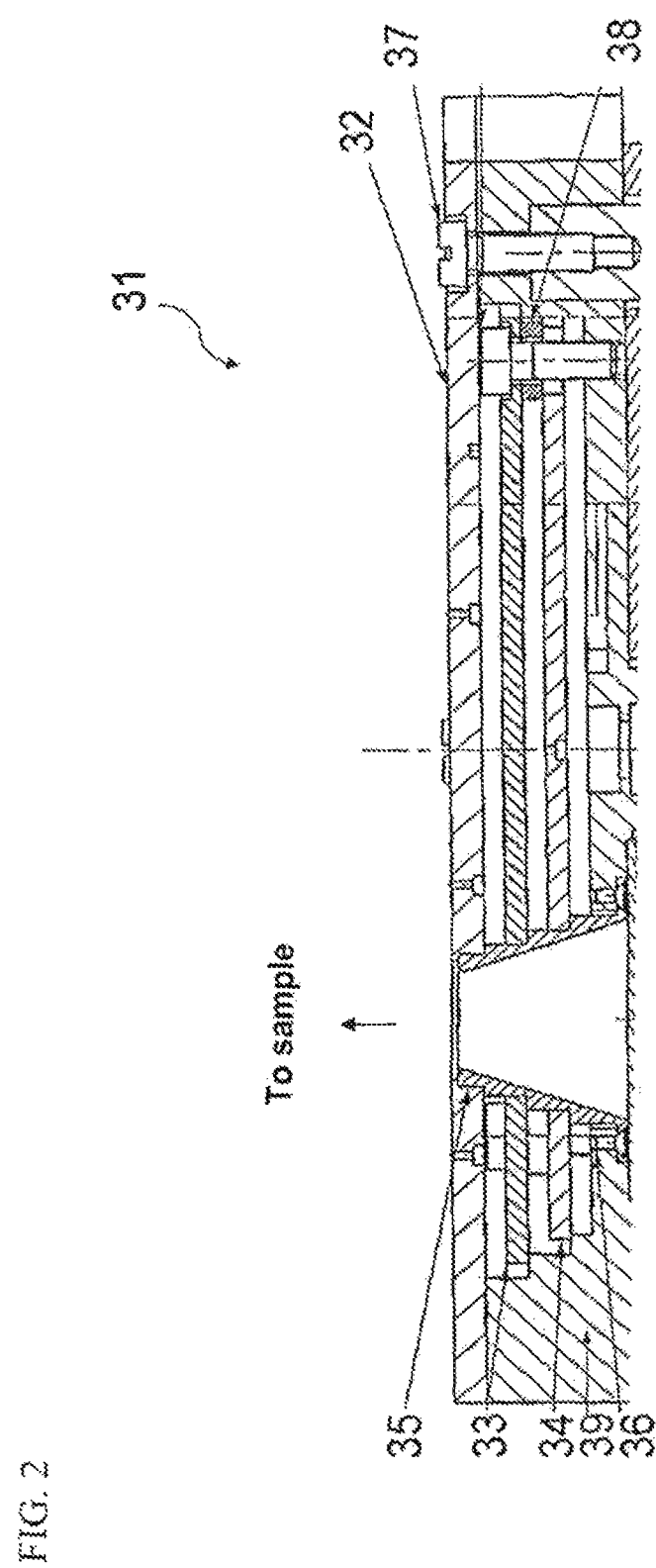
FIG. 2: A section through the showerhead electrode according to the invention (technical drawing).

FIG. 2 shows a section of a showerhead electrode arrangement according to the invention, with three gas distribution plates fitted into a stainless steel support 39. In the section view, a first gas distribution plate 32 can be seen facing the substrate (not shown in the FIG., but theoretically disposed above the electrode 31). This first plate is fastened to the support with two screws 37. A second gas distribution plate 33 and a third gas distribution plate 34 are separated from one another by spacer ring 38. The diameter of the gas distribution plates continuously increases from gas distribution plate 32 to gas distribution plate 34. The hole in plate 32 has an inside diameter of 10 mm, the hole in plate 33 is 16 mm and the hole in plate 34 is 19 mm in diameter.

Figure 4:
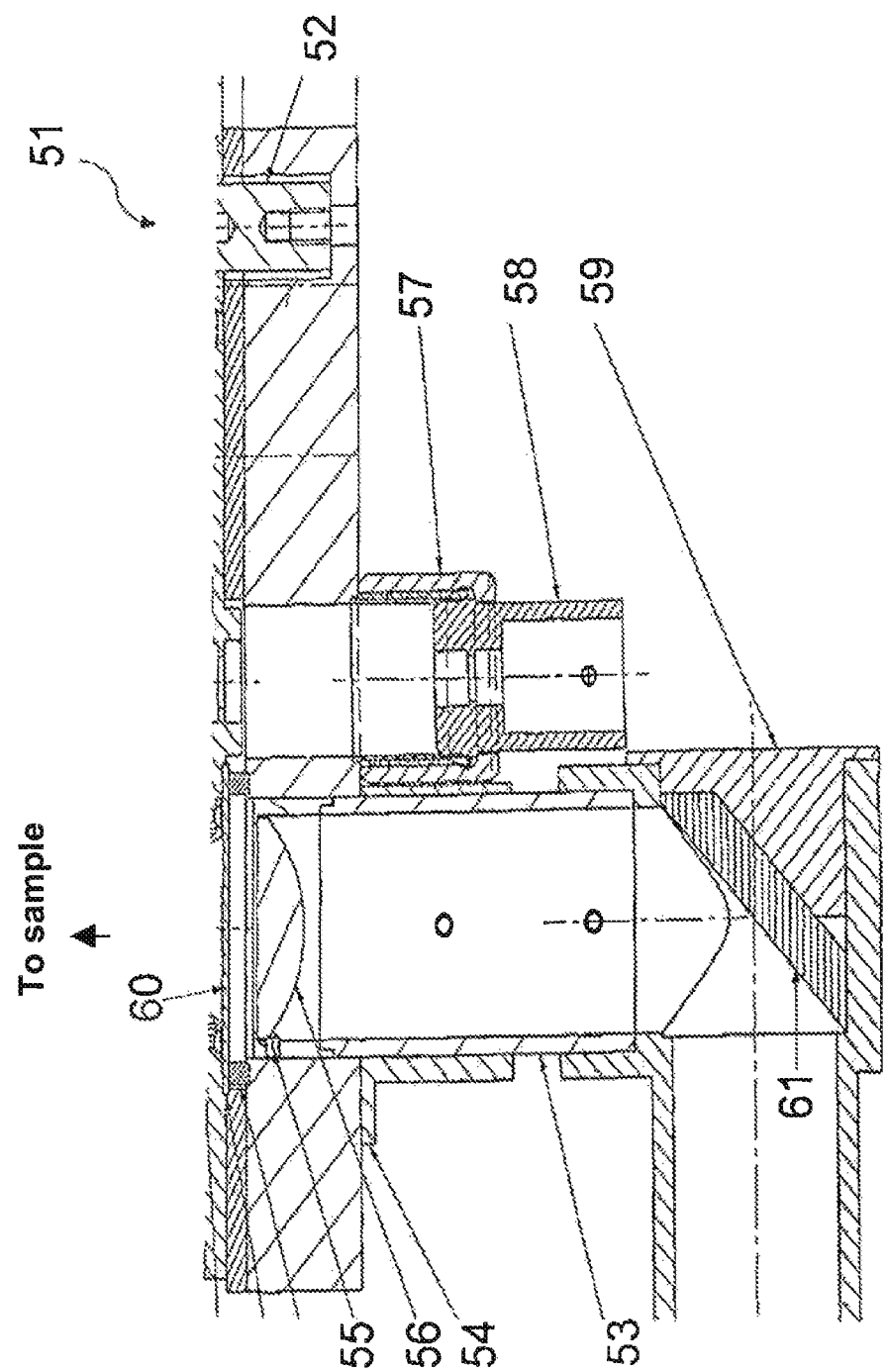
FIG. 4: A section through the plasma chamber according to the invention (technical drawing).

Reference number 35 indicates a stepped funnel as a physical component. The funnel 35 has edge steps directed outward, on which the gas distributor plates 32, 33 and 34 sit. A protruding border, which is provided with two or more bores in the edge thereof, is disposed at the lower end of the funnel. The bores are provided for screws 36. Only the left of the two screws 36 is given a reference number. The entire electrode 31 comprising the plates and the support 39 is fastened in the plasma chamber using ceramic supports 52 as shown in FIG. 4.

The gas distribution plates 32 to 34 facilitate a homogeneous gas distribution in the plasma space (at the top in the drawing). By providing an increasing number of gas distribution holes per gas distribution plate, from bottom to top in the drawing, the required pressure gradient is achieved. This causes the gas to flow homogeneously from the uppermost plate 32 into the plasma chamber thereabove. To this end, the gas is first introduced to the areas located below plate 34. The funnel in the optical feedthrough prevents the gas from exiting through the optical feedthrough and keeps it gastight.

The angle of the cone and the size of the feedthrough 35 through the hole pattern in the gas distribution plates is determined by the three gas distribution plates themselves. These should be altered as little as possible by the feedthrough 35. The diameter of the upper opening of the feedthrough in the cone is 1 cm, and the diameter of the lower opening is 2.2 cm.

The conical feedthrough was selected so to achieve as large acceptance angle as possible for gathering electromagnetic radiation, with a small opening in the upper electrode. In the present case, the showerhead electrode has a diameter of 13.7 cm. Industrially, however, substrate sizes of up to 5.7 m$^2$ are now being coated. Furthermore, the substrate does not have to be located above the electrode 32. The showerhead electrode can also be above the substrate. This would correspond to the arrangement in FIG. 2 "upside down." Furthermore, the electrode and the counter-electrode can be arranged vertically. This corresponds to tilting by 90°.

Figure 3:
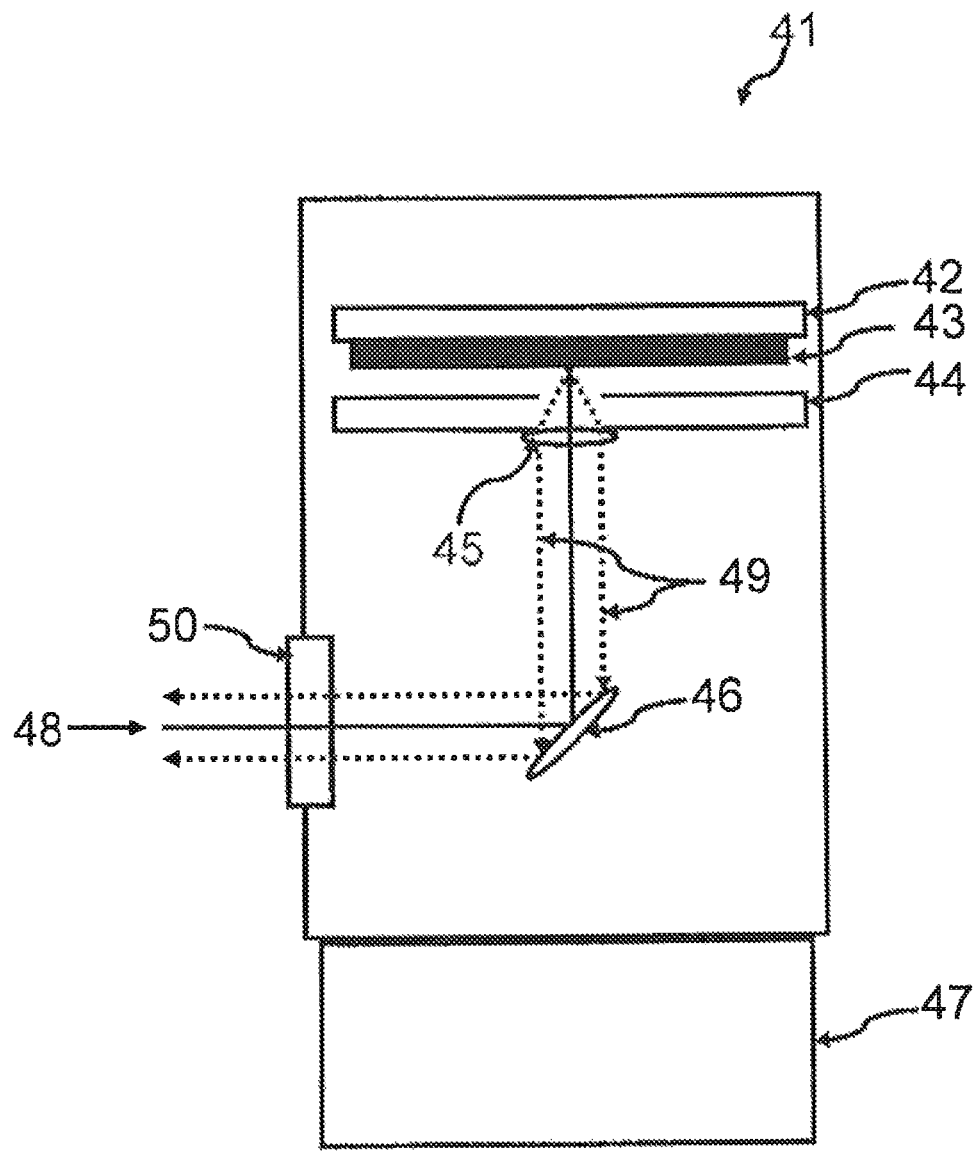
FIG. 3: A section through the plasma chamber according to the invention (schematic drawing).

FIG. 3 schematically illustrates placement in a vacuum chamber 41 according to the invention. Due to the arrangement of the turbopump 47 in this example, a straight-line radiation path is not possible, making the 45° turn using the mirror 46 necessary. The distance from the RF electrode 44 according to the invention, and thus the distance of the lens 45, to the substrate 43 is height-adjustable and variable from approximately 5 mm to approximately 25 mm. This corresponds to the distances used in industry for the deposition of silicon during the PECVD process. Reference number 42 indicates the counter-electrode where the substrate 43 is located. An excitation laser, not shown, generates the radiation 48, which is focused onto the substrate or a layer deposited thereon, through a window 50 in the chamber wall and through the converging lens 45. Reference number 49 indicates the (Raman) radiation gathered by the lens, the radiation being supplied through the lens 45 to the mirror 46. The radiation 49 is directed by the mirror 46 to the spectrometer (not shown) for further analysis. The angle of incidence is zero degrees.

FIG. 4 shows the practical application of FIG. 3 in a technical cross section. The plano-convex converging lens 56 focuses the excitation radiation onto the sample and gathers the Raman radiation (not shown). The focal length of the lens 56 is selected such that the substrate surface lies at the focal point (here 38 mm). The lens 56 is held in place in the support with a screw 55.

The small glass plate 60 above the lens 56 was installed to prevent the lens from being coated during the deposition of the sample layer (not shown). This allows the optics to be cleaned easily, which is advantageous. The optical feedthrough is not shown in this figure. To couple the radiation in and out, a mirror 61 is disposed at a 45° angle relative to the support.

The mirror 61 is disposed in a support together with the lens 56. This support 53 is attached to the electrode in a height-adjustable manner so that different distances between the electrode and the layer and the layer itself can be spectroscopically examined variably. The height-adjustability is made possible by a screw in a slot (cannot be seen in this drawing).

Figure 5:
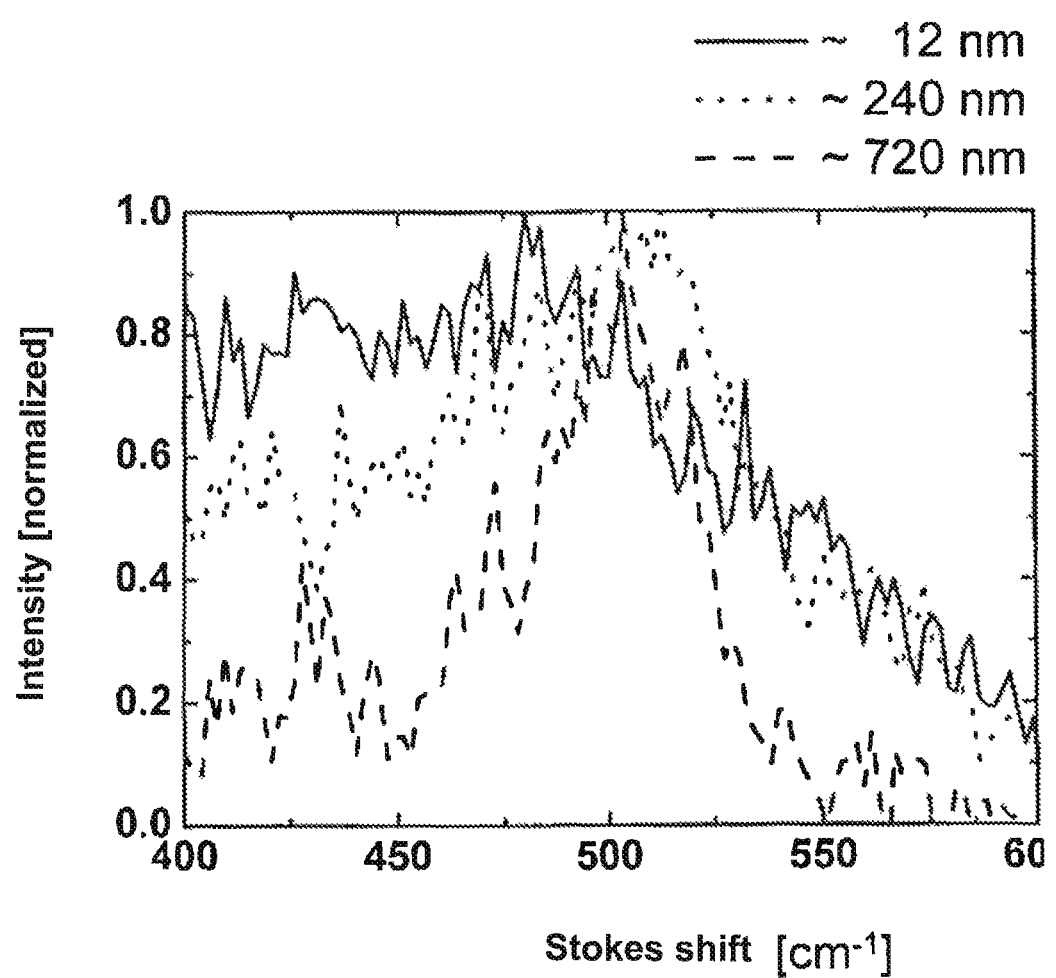
FIG. 5: The intensity of the Stokes shift is measured in situ as a function of the magnitude of the shift, which forms the basis of Raman spectroscopy, by way of the RF electrode construction according to the invention with the optical feedthrough and placement in the plasma chamber.

FIG. 5 shows the in situ measurement of the intensity of the Stokes shift as a function of the magnitude of the shift, made possible by the RF electrode construction according to the invention with the optical feedthrough and placement in the plasma chamber—this measurement is the basis of Raman spectroscopy. Shown are measurements at different stages of layer deposition. After approximately 12 nm of deposited silicon layer, a signal can be seen which can be associated with the glass substrate. After approximately 240 nm, the measurement signal shows a typical characteristic for microcrystalline silicon. The Stokes shift of microcrystalline silicon can be broken down into two portions. The first portion is caused by the microcrystalline phase and has an intensity maximum at −520 cm$^{-1}$. The second portion is caused by the amorphous phase. Its intensity maximum is at −480 cm$^{-1}$. Since the deposition takes place at approximately 200° C., the intensity maximum of the microcrystalline phase is at a Stokes shift of approximately 505 relative wavenumbers, and the intensity maximum of the amorphous phase is ~460 cm$^{-1}$. At a deposited layer thickness of approximately 720 nm, the signal is even more pronounced since the contribution from the glass substrate has now been completely suppressed.

Figure 6:
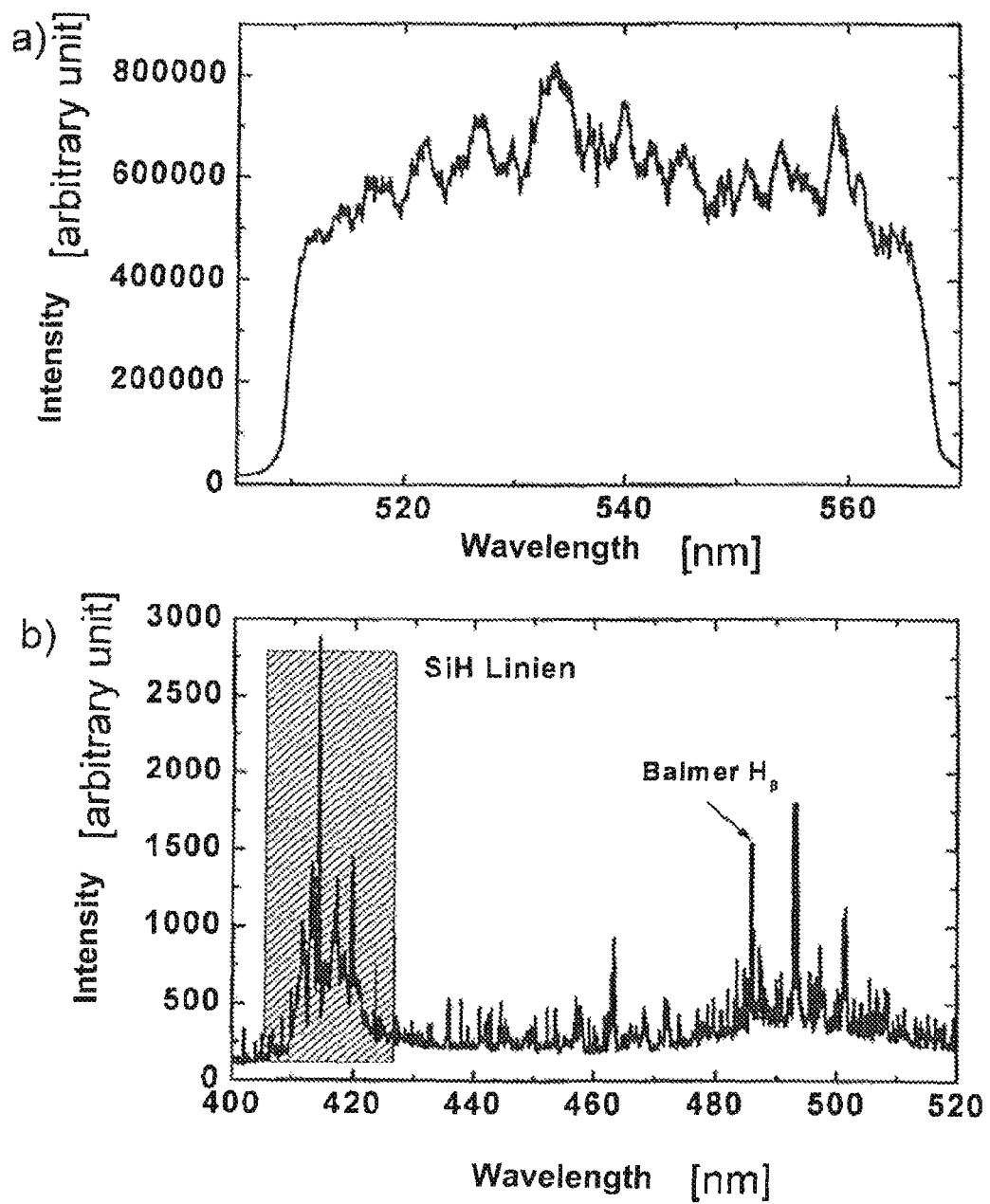
FIG. 6: The wavelength is measured in situ as a function of the intensity as a basis for the determination of the SiH4 concentration in the plasma chamber, by way of the electrode construction according to the invention with the optical feedthrough and placement in the plasma chamber.

FIG. 6a) shows the in situ measurement of the intensity of the optical emission of the plasma as a function of wavelength in a range of 505 nm to 570 nm, made possible by the electrode construction according to the invention with the optical feedthrough and placement in the plasma chamber. If the measurement is done in a larger spectral range, as shown in FIG. 6b), the ratio of two emission lines, for example, can be used to determine gas concentrations in the plasma.

The invention claimed is:

1. An RF electrode for generating plasma in a plasma chamber, comprising at least one optical feedthrough wherein the RF electrode is a showerhead, and wherein a funnel having a conical inner diameter lines the optical feedthrough of the showerhead in a gas-tight manner.

2. The electrode according to claim 1, wherein the optical feedthrough is large enough to allow in situ Raman spectroscopy or optical emission spectroscopy to be carried out through the RF electrode.

3. An electrode according to claim 1, wherein the optical feedthrough has a conical section.

4. The electrode according to claim 3, wherein the smaller of the two openings of the feedthrough has an area of 0.03 cm$^2$ to 5 cm$^2$.

5. An electrode according to claim 3, wherein the larger of the two openings of the feedthrough has an area of 0.031 to 100 cm$^2$.

6. An electrode according to claim 1, wherein an opening of the optical feedthrough comprises a shielding.

7. The electrode according to claim 6, comprising a metallic mesh as a shielding for the optical feedthrough, the mesh being disposed on the opening of the optical feedthrough.

8. An electrode according to claim 1, comprising a converging lens.

9. The electrode according to claim 8, comprising a small glass plate for protecting the converging lens against a gas in the plasma chamber is disposed between the converging lens and the opening of the optical feedthrough.

10. A plasma chamber, comprising an RF electrode according to claim 1 and a counter-electrode with a substrate support for holding a substrate, wherein a high-frequency alternating field for generating the plasma can be formed between the RF electrode and the counter-electrode.

11. The plasma chamber according to claim 10, wherein a convex converging lens disposed in the plasma chamber can focus electromagnetic radiation through the optical feedthrough onto the layer or onto the plasma, and radiation scattered or reflected through the optical feedthrough, or radiation emitted from the layer or the plasma, can be parallelized and supplied to an analysis unit for the purposes of analyzing the scattered or reflected or emitted radiation.

12. The plasma chamber according to claim 11, comprising a converging lens that can be moved in the beam path of the plasma chamber.

13. A method for in situ analysis or in situ processing of a layer or plasma in a plasma chamber according to claim 10, wherein the layer is disposed on a counter-electrode and an RF electrode is disposed on the side facing the layer, comprising selecting an RF electrode and for generating plasma in a plasma chamber having at least one optical feedthrough at least one step in which the electromagnetic radiation is supplied from the plasma chamber through the optical feedthrough in the RF electrode to an analysis unit.

14. The method according to claim 13, wherein in situ Raman spectroscopy of the growing layer or optical emission spectroscopy of the plasma is performed, wherein the electromagnetic radiation is supplied to the analysis unit by way of a converging lens.

15. The electrode, plasma chamber or method according to claim 9, wherein more than one gas distribution plate is disposed in the showerhead.

16. The electrode according to claim 1, wherein the conical funnel has a first opening facing the plasma space with a larger area than a second opening of the funnel opposite the first opening.

* * * * *